(12) United States Patent
Yanase et al.

(10) Patent No.: US 10,353,283 B2
(45) Date of Patent: Jul. 16, 2019

(54) ADHESIVE FOR PELLICLE, PELLICLE, AND METHOD OF SELECTING ADHESIVE FOR PELLICLE

(71) Applicant: SHIN-ETSU CHEMICAL CO., LTD., Tokyo (JP)

(72) Inventors: Yu Yanase, Annaka (JP); Jun Horikoshi, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 76 days.

(21) Appl. No.: 15/638,956

(22) Filed: Jun. 30, 2017

(65) Prior Publication Data

US 2018/0011397 A1    Jan. 11, 2018

(30) Foreign Application Priority Data

Jul. 11, 2016 (JP) ................................ 2016-137076

(51) Int. Cl.
*G03F 1/64* (2012.01)
*C08F 220/18* (2006.01)
*C09J 133/12* (2006.01)

(52) U.S. Cl.
CPC .............. *G03F 1/64* (2013.01); *C08F 220/18* (2013.01); *C09J 133/12* (2013.01); *C09J 2433/00* (2013.01)

(58) Field of Classification Search
CPC .......... G03F 1/64; C08F 220/18; C09J 133/12
USPC ........................................................... 430/5
See application file for complete search history.

(56) References Cited

U.S. PATENT DOCUMENTS

| | | | |
|---|---|---|---|
| 4,657,805 A | 4/1987 | Fukumitsu et al. | |
| 4,878,973 A | 11/1989 | Ohtake et al. | |
| 9,910,349 B2 * | 3/2018 | Horikoshi | C09J 183/08 |
| 2006/0110664 A1 | 5/2006 | Hamada | |
| 2014/0170535 A1 | 6/2014 | Yano et al. | |

FOREIGN PATENT DOCUMENTS

| | | |
|---|---|---|
| EP | 3 056 943 A1 | 8/2016 |
| JP | S58-219023 A | 12/1983 |
| JP | S60-083032 A | 5/1985 |
| JP | 2006-146085 A | 6/2006 |
| JP | 2011-107468 A | 6/2011 |
| JP | 2013-134482 A | 7/2013 |
| JP | 5638693 B2 | 12/2014 |
| JP | 2016-018008 A | 2/2016 |

OTHER PUBLICATIONS

Nov. 17, 2017 European Search Report issued in Patent Application No. 17180463.6.

* cited by examiner

*Primary Examiner* — Christopher G Young
(74) *Attorney, Agent, or Firm* — Oliff PLC

(57) ABSTRACT

Provided are an adhesive comprising substantially no surface modifier and leaving a less residue behind after a pellicle is separated; a pellicle; and a method of selecting an adhesive leaving a less residue behind. More specifically, provided are an adhesive for a pellicle having a ratio of a peel strength to a tensile strength of from 0.10 to 0.33; a pellicle comprising a pellicle frame, a pellicle film provided over an upper end face of the pellicle frame, and the adhesive adhered to a lower end face of the pellicle frame; and a method of selecting an adhesive, comprising the steps of: measuring a peel strength and a tensile strength of an adhesive, and selecting an adhesive having a ratio of the former to the latter of from 0.10 to 0.33 as the adhesive for a pellicle.

7 Claims, 1 Drawing Sheet

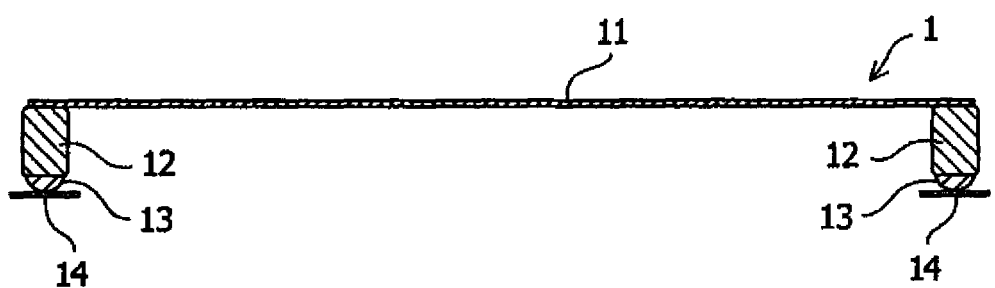

ADHESIVE FOR PELLICLE, PELLICLE, AND METHOD OF SELECTING ADHESIVE FOR PELLICLE

BACKGROUND OF THE INVENTION

1. Field of the Invention

The invention relates to a pellicle for lithography used as a dust cover when semiconductor devices, printed boards, liquid crystal displays, and similar devices are produced.

2. Related Art

In the production of semiconductors such as LSIs and super-LSIs, liquid crystal displays or similar devices, a semiconductor wafer or a master plate for liquid crystal is irradiated with light to form a pattern. When a photomask or a reticle (hereinafter simply called "photomask") having dust attached is used for the patterning, the resulting pattern has roughened edges, or the base has black stains, resulting in impaired dimensions, a lower quality, or a poor appearance, for example.

To address these problems, such a process is typically performed in a clean room, but it is still difficult to constantly keep a photomask clean. Hence, a pellicle is attached as a dust cover to the surface of a photomask before exposure to light. In this case, foreign substances do not directly adhere to the surface of the photomask but adhere onto the pellicle. When the focus for lithography is set on a pattern on the photomask, the foreign substances on the pellicle do not interfere with the transfer.

In the typical production of a pellicle, a good solvent for a pellicle film is applied on the upper end face of a pellicle frame made of aluminum, stainless steel, polyethylene or the like; then a transparent pellicle film of nitrocellulose, cellulose acetate, a fluorocarbon resin or the like, which sufficiently transmits light, is placed thereon; and the solvent is air-dried to bond the pellicle film (JP 58-219023A). Alternatively, an adhesive such as an acrylic resin adhesive and an epoxy resin adhesive is used to attach a pellicle film to the pellicle frame (JP 60-083032A). The pellicle further comprises an adhesive layer comprising a polybutene resin, a polyvinyl acetate resin, an acrylic resin, a silicone resin or the like at the lower end face of the pellicle frame for bonding the pellicle to a photomask; and a release layer (separator) for protecting the adhesive layer.

The adhesive to come in direct contact with a photomask is required to have such adhesiveness as not to detach a pellicle from the photomask during exposure to light and as to reduce a residue after a pellicle is separated. Basically, a pellicle can be used semi-permanently. When an unusualness of a photomask or an unusualness of a pellicle is observed after attachment of a pellicle, the pellicle is separated, then the photomask is washed or reprocessed, and the pellicle may be attached once again. To facilitate the regeneration of the photomask in such a case, there is a demand for an adhesive that leaves a less residue behind after a pellicle is separated.

These years, semiconductors having much finer patterns have been developed so that the wavelength of a light source has been shortened. The exposure technique has been shifting from g-rays (436 nm) or i-rays (365 nm) by a mercury lamp mainly used in earlier years, to KrF excimer laser (248 nm), ArF excimer laser (193 nm), EUV (13.5 nm) and the like in recent years. As the wavelength of the light is shortened, the flatness of a photomask greatly affects the exposure patterning accuracy. On this account, the adhesive is required to leave a much less residue behind so as not to distort a photomask when a pellicle is separated and so as to facilitate the regeneration of a photomask.

As a conventional technique to reduce a residue, addition of a surface modifier or the like into an adhesive is disclosed (Japan Patent No. 5638693 and JP 2016-018008A). As another technique to reduce a residue, a large pellicle comprising an adhesive layer having a cohesive breaking strength of 20 $g/mm^2$ or more is disclosed (JP 2006-146085A).

SUMMARY OF THE INVENTION

As for the addition of a surface modifier or the like into an adhesive to reduce a residue, a reduction of outgassing from a pellicle is required due to a current trend of finer patterning in an exposure process, so that it is not preferred to add such a potentially gas-generating compound as the surface modifier to the adhesive. In addition, there is also concern that the added compound may adhere to or remain on a photomask. As for the increase in cohesive breaking strength of an adhesive layer to reduce a residue, the inventors have studied various types of adhesives on a pellicle for semiconductors, and found that the cohesive breaking strength greatly varies with the type of the main component of an adhesive and an adhesive having a high cohesive breaking strength does not always bring good results.

The invention has been made for solving the above problem. An object of the invention is to provide an adhesive being free from addition of a compound such as a surface modifier and leaving a less residue behind after a pellicle is separated; a pellicle; and a method of selecting an adhesive for a pellicle, the adhesive leaving a less residue behind.

As a result of intensive studies for solving the above problem, the inventors have found that an adhesive having a particular tensile strength and a particular peel strength leaves a less residue behind and is suited for the adhesive for a pellicle, and have completed the invention.

In an aspect of the invention, there can be provided an adhesive for a pellicle, the adhesive having a ratio of a peel strength to a tensile strength of from 0.10 to 0.33.

In another aspect of the invention, there can be provided a pellicle comprising a pellicle frame, a pellicle film provided over an upper end face of the pellicle frame, and the adhesive adhered to a lower end face of the pellicle frame.

In still another aspect of the invention, there can be provided a method of selecting the adhesive for a pellicle, comprising the steps of: measuring a tensile strength and a peel strength of an adhesive, and selecting the adhesive having a ratio of the peel strength to the tensile strength of from 0.10 to 0.33 as the adhesive for a pellicle.

According to the invention, the adhesive does not comprise such a compound as a surface modifier which may cause outgassing or remain on a photomask, and can reduce a residue after a pellicle is separated, so that it is suitable for an adhesive for a pellicle. The adhesive facilitates the regeneration of a photomask and does not distort a photomask. In addition, the outgassing from the pellicle can be reduced. A conventional method of selecting a novel adhesive comprises residue evaluation in which a pellicle attached to a photomask is left to stand for several months, and then the pellicle is separated for observation of a residue. According to the invention, the method is capable of selecting the adhesive leaving a less residue behind for a short period of time.

BRIEF DESCRIPTION OF THE DRAWING

FIG. 1 is a schematic cross-sectional view of an embodiment of a pellicle according to the invention.

DETAILED DESCRIPTION OF THE PREFERRED EMBODIMENTS

A pellicle comprises a pellicle frame, a pellicle film provided over an upper end face of the pellicle frame, and an adhesive for a pellicle adhering to a lower end face of the pellicle frame, and may further comprises, on the lower end face of the adhesive, an optional release layer (separator) for protecting the adhesive.

The pellicle frame corresponds to the shape of a photomask to which the pellicle is attached, and typically has a quadrangular frame shape such as a rectangular frame shape or a square frame shape.

A material of the pellicle frame is not particularly limited, and a known material can be used. Examples of the material include aluminum, aluminum alloys, iron, iron alloys, ceramics, ceramic-metal composite materials, carbon steel, tool steel, stainless steel, and carbon fiber composite materials. Specifically, a metal material including aluminum and aluminum alloys is preferred from the standpoint of strength, rigidity, lightweight, processability and cost.

A pellicle frame subjected to an optional treatment such as anodic oxidation, plating, polymer coating or painting may be used. The optional treatment is not particularly limited.

The surface of the pellicle frame preferably has a black tone. Such a pellicle frame can suppress the reflection of exposure light and facilitates the detection of foreign substances in a foreign substance inspection, enabling the production of a preferable pellicle. Such a pellicle frame can be prepared, for example, by subjecting an aluminum alloy pellicle frame to black alumite treatment.

The pellicle frame may have a pressure-adjusting hole. When provided, a pressure-adjusting hole can eliminate the difference in atmospheric pressure between the inside and the outside of the closed space defined by a pellicle and a photomask, so that a pellicle film can be prevented from swelling or deflating.

The pressure-adjusting hole preferably comprises a dust filter. The dust filter can prevent foreign substances from entering through the pressure-adjusting hole into the closed space defined by a pellicle and a photomask.

An adhesive may be applied onto the inner surface of the pellicle frame to capture foreign substances present in the closed space defined by a pellicle and a photomask.

An adhesive for a pellicle is provided on the lower end face of the pellicle frame for attaching the pellicle to a photomask. Typically, the adhesive is provided over the whole circumference on the lower end face of a pellicle frame, and has the same width as or a smaller width than that of the pellicle frame.

According to the invention, the adhesive for a pellicle has a ratio of the peel strength to the tensile strength (peel strength/tensile strength) of 0.10 or more but 0.33 or less. When the ratio of the peel strength to the tensile strength of an adhesive is 0.33 or less, the residue can be reduced when a pellicle is released from a photomask. In addition, the ratio can be quantitatively evaluated so that a new adhesive leaving a less residue behind can be selected for a short period of time, not requiring the storage of a pellicle having a photomask attached for several months before the pellicle is separated to observe a residue as a conventional residue evaluation.

The tensile strength of an adhesive can be determined by the tensile test with an autograph. The tensile test for adhesives is not defined in Japanese Industrial Standard (JIS) so that the test is carried out in accordance with JIS K 6251:2010 (ISO 37:2005) "Rubber, vulcanized or thermoplastics—Determination of tensile stress-strain properties" with the following modification. An adhesive to be cured is poured into a strip-shaped mold having 13 mm×20 mm to obtain thickness of 1 mm, air-dried, and then heated for curing to obtain a test specimen. The test specimen is held with length of 20 mm by jigs of the autograph and is pulled at a constant speed of 300 mm/min. The stress when the adhesive test specimen is broken is regarded as the tensile strength ($N/cm^2$). In the tensile test, the elongation percentage when the adhesive test specimen is broken is regarded as stroke (%).

The peel strength of an adhesive is determined by attaching a photomask to the adhesive having a thickness of 0.3 mm which is provided over the whole circumference on the lower end face of a pellicle frame and has the same width as that of the pellicle frame. The pellicle frame is attached to the photomask through the adhesive to be evaluated, and is left to stand until air between the adhesive and the photomask is removed. A peeler is used to grip a long side of the pellicle and to pull the pellicle at a constant speed. The load is measured until the pellicle is completely separated from the photomask. The maximum load (N) is divided by a peel area ($cm^2$) to obtain a peel strength ($N/cm^2$). It should be noted that the photomask typically comprises a quartz substrate and a light-shielding chromium (Cr) film on the quartz substrate, wherein the light-shielding film forms a mask pattern. The pellicle is attached to the light-shield film in many cases. Thus, a quartz substrate treated with Cr may be used instead of the photomask.

The adhesive for a pellicle preferably has a stroke of 660% or less, which is the elongation percentage of the adhesive test specimen when the adhesive test specimen is broken in the tensile test. It has been found that an adhesive having a stroke of 660% or less can further reduce a residue when a pellicle is separated from a photomask. The adhesive also functions as a cushioning material or a sealing material so that it is required to have a certain degree of flexibility. For this reason, the stroke is preferably 200% or more.

The adhesive for a pellicle preferably has a peel strength of 1.20 $N/cm^2$ or more. When an adhesive having a peel strength of less than 1.20 $N/cm^2$ is used to attach a pellicle to a photomask, air is likely to generate so that it may also be difficult to stably hold a pellicle on a photomask for a long time. An adhesive having a small peel strength is likely to have a smaller ratio of the peel strength to the tensile strength. The ratio of the peel strength to the tensile strength is substantially and preferably 0.10 or more. The upper limit of the peel strength is variable depending on the formulation of an adhesive to be used. The upper limit of the peel strength is not particularly limited, and is preferably 30 $N/cm^2$ from the standpoint of workability during separation.

The peel strength can be determined by the method comprising the steps of: attaching a pellicle to a 6-inch quartz substrate treated with Cr through an adhesive having a thickness of 0.3 mm which is provided over the whole circumference on the lower end face of a pellicle frame and has the same width as that of the pellicle frame, at a pressure of 4.8 gf/$mm^2$ for 30 seconds; allowing the resulting attachment to stand for a day at room temperature (23±3° C.) to settle the adhesive on the quartz substrate; and completely separating the pellicle from the quartz substrate treated with Cr at a speed of 0.1 mm/s, while gripping a long side of the pellicle with a peeler having a load cell, wherein a maximum load is divided by a peel area to obtain the peel strength.

Examples of the adhesive for a pellicle include an acrylic adhesive or a silicone adhesive. In particular, the acrylic adhesive is preferably used since it is easy to obtain an intended tensile strength and an intended peel strength.

The acrylic adhesive preferably include a cured product of an alkyl (meth)acrylate copolymer. In the description of the present specification, "(meth)acrylic" means acrylic or methacrylic. For example, an alkyl (meth)acrylate copolymer means an alkyl acrylate copolymer or an alkyl methacrylate copolymer.

Examples of the alkyl (meth)acrylate copolymer may include a copolymer preferably containing 90 to 99% by weight of alkyl (meth)acrylate monomer units and 1 to 10% by weight of monomer units having reactivity with an epoxy group or an isocyanate group relative to all of the monomer units (repeating units).

The alkyl (meth)acrylate monomer unit may be preferably selected from monomer units such as methyl (meth)acrylate, ethyl (meth)acrylate, propyl (meth)acrylate, butyl (meth)acrylate, hexyl (meth)acrylate, octyl (meth)acrylate, decyl (meth)acrylate, dodecyl (meth)acrylate, lauryl (meth)acrylate, isopropyl (meth)acrylate, isobutyl (meth)acrylate, isoamyl (meth)acrylate, 2-ethylhexyl (meth)acrylate, isooctyl (meth)acrylate, and isononyl (meth)acrylate.

The monomer unit having reactivity with an epoxy group or an isocyanate group may be preferably selected from monomer units including carboxyl group-containing monomers such as (meth)acrylic acid and hydroxyalkyl group-containing (meth)acrylates such as 2-hydroxyethyl (meth)acrylate.

As the alkyl (meth)acrylate copolymer, acrylic adhesives commercially available from Soken Chemical & Engineering Co., Ltd, such as SK-1425 and SK-1495 in SK-Dyne series, may be used. From the standpoint of adhesiveness or workability, SK-1495 and SK-1473H are preferred.

As a curing agent to prepare a cured product of an alkyl (meth)acrylate copolymer, a polyisocyanate compound containing two or more isocyanate groups may be preferably used.

The isocyanate compound is preferably exemplified by tolylene diisocyanate. A polyepoxy compound containing two or more epoxy groups may also be used.

The cured product is preferably prepared by heating at 80 to 200° C.

The adhesive for a pellicle is not required to contain a surface modifier or the like and does not preferably contain an additive compound such as a surface modifier which may cause outgassing or remain on a photomask. Examples of the surface modifier include a silane compound described in Japanese Patent No. 5638693 and a block copolymer of compatible and incompatible segments described in JP 2016-018008A, where the compatible segment is composed of a homopolymer of vinyl monomers or a copolymer of vinyl monomers, and the incompatible segment is composed of a fluorine compound or a silicone-containing compound.

When the adhesive for a pellicle is an acrylic adhesive, the tensile strength, the stroke and the peel strength may be adjusted by curing after appropriately changing the types and/or the quantities of an alkyl (meth)acrylate copolymer and a curing agent. When an acrylic adhesive is used, it is preferable to mix 0.01 to 1.0 part by weight of a curing agent with 100 parts by weight of the alkyl (meth)acrylate copolymer and to cure the resulting mixture.

A material of the pellicle film is not particularly limited. The material having a high transmission at the wavelength of an exposure light source and having high light resistance is preferred. For example, an amorphous fluoropolymer conventionally used for excimer laser can be used. The amorphous fluoropolymer is exemplified by CYTOP (trade name by Asahi Glass Co., Ltd.), Teflon (registered trademark), and AF (trade name by DuPont). Such a polymer may be optionally dissolved in a solvent such as a fluorine solvent during the preparation of a pellicle film.

To bond a pellicle film to a pellicle frame, a good solvent for the pellicle film may be applied onto the pellicle frame, and then the pellicle film may be placed thereon and air-dried. Alternatively, an acrylic resin adhesive, an epoxy resin adhesive, a silicone resin adhesive, a fluorine-containing silicone adhesive or the like may be used to bond the film to the pellicle frame.

The material of the release layer (separator) is not particularly limited. Exampled of the material include polyethylene terephthalate (PET), polytetrafluoroethylene (PTFE), tetrafluoroethylene/perfluoroalkyl vinyl ether copolymer (PFA), polyethylene (PE), polycarbonate (PC), polyvinyl chloride (PVC) and polypropylene (PP). A release agent such as a silicone release agent and a fluorine release agent may be optionally applied onto the surface of the release layer.

FIG. 1 shows a longitudinal sectional view of an embodiment of the pellicle in accordance with the invention. A pellicle 1 comprises a pellicle film 11 provided over an upper end face of a pellicle frame 12 and an adhesive 13 which adheres to a lower end face of the pellicle frame 12 and is for attaching the pellicle 1 to a photomask. A release layer (separator) 14 for protecting the adhesive 13 is releasably provided to the lower end face of the adhesive 13.

According to the invention, a method of selecting an adhesive for a pellicle can be provided. The method comprises a step of measuring the tensile strength and the peel strength of an adhesive to select the adhesive having a ratio of the peel strength to the tensile strength of 0.10 or more but 0.33 or less as the adhesive for a pellicle. When a novel adhesive is selected in a conventional residue evaluation, a pellicle attached to a photomask is left to stand for several months, and then the pellicle is separated to observe a residue. On the other hand, according to the invention, the method allows the novel adhesive leaving a less residue behind to be selected for a short period of time.

EXAMPLES

The invention will next be described specifically with reference to Examples and Comparative Examples. It should not be construed that the invention is limited to or by Examples.

Example 1

First, an aluminum alloy pellicle frame having outer dimensions of 149 mm×115 mm×3.15 mm and a frame width of 2 mm was placed in a clean room, then sufficiently washed with a neutral detergent and pure water, and dried. An adhesive was prepared by subjecting 100 parts by weight of the acrylic adhesive (SK-Dyne 1495 manufactured by Soken Chemical & Engineering Co., Ltd.) to addition of 0.09 part by weight of the isocyanate curing agent (L-45 manufactured by Soken Chemical & Engineering Co., Ltd.) and to mixing. The prepared adhesive was applied with an automatic dispenser (manufactured by Iwashita Engineering, Inc.) onto the whole lower end face of the pellicle frame to obtain an adhesive layer having a thickness of 0.3 mm. The adhesive layer was then air-dried until the adhesive did not flow, and the pellicle frame was heated to 150° C. by using a high-frequency induction heater to cure the adhesive.

A pellicle film was attached to the upper end face of the pellicle frame through the adhesive, CYTOP CTX-A (manufactured by Asahi Glass Co., Ltd.), and the unnecessary film out of the frame was cut to complete a pellicle.

The completed pellicle and the adhesive were subjected to the following evaluations. The results are shown in Table 1.

<Measurement of Tensile Strength>

The prepared adhesive was poured in a mold having dimensions of 13 mm×20 mm to obtain a thickness of 1 mm, then air-dried, and heated to 150° C. to obtain a test specimen. The test specimen was placed in the testing machine, Autograph AG-IS (trade name by Shimadzu Corporation) so as to have a length of 20 mm, and was pulled at a speed of 300 mm/min to determine the tensile strength when the test specimen was broken. The stroke (%) was also determined at the time of breaking. Three test specimens were measured, and the average thereof was used for the tensile strength.

The tensile strength is the value obtained by dividing a tensile load by a cross-sectional area. As the cross-sectional area, the cross-sectional area of each specimen before measurement was used, which was 0.13 cm$^2$.

<Measurement of Peel Strength>

Each pellicle produced in Examples and Comparative Examples was attached to a 6-inch quartz substrate treated with Cr through an adhesive at a load of 5 kgf (a pressure of 4.8 gf/mm$^2$) for 30 seconds, and left to stand for a day at room temperature (23±3° C.) to settle the adhesive on the substrate. Then the pellicle was completely separated from the quartz substrate treated with Cr at a speed of 0.1 mm/s, while gripping a long side of the pellicle with a peeler having a load cell, wherein a maximum load was divided by a release area to obtain the peel strength.

In these measurements, the adhesive was applied onto the whole lower end face of the pellicle frame so that the release area was 10.4 cm$^2$.

<Residue Evaluation>

Each pellicle produced in Examples and Comparative Examples was attached to a 6-inch quartz substrate treated with Cr through an adhesive at a load of 5 kgf (a pressure of 4.8 gf/mm$^2$) for 30 seconds, and then left to stand for a day at room temperature (23±3° C.) to settle the adhesive on the substrate. Then the pellicle was completely separated from the quartz substrate treated with Cr at a speed of 0.1 mm/s, while gripping a long side of the pellicle with a peeler having a load cell. The residue on the quartz substrate after the separation was observed under a microscope. The residual amount of each adhesive was evaluated as the percentage of "residual area"/"attachment area".

F: the residual amount is not less than 10%,
B: the residual amount is not less than 5% but less than 10%, and
A: the residual amount is not less than 0% but less than 5%.

<Evaluation of Attachment Properties>

Each pellicle produced in Examples and Comparative Examples was attached to a 6-inch quartz substrate treated with Cr through an adhesive at a load of 5 kgf (a pressure of 4.8 gf/mm$^2$) for 30 seconds, and left to stand for a day at room temperature (23±3° C.) to settle the adhesive on the substrate. The adhesion face was then observed visually and under a microscope.

good: no unusualness is observed, and
bad: air is mixed into the adhesion face.

<Evaluation of Durability>

Each pellicle produced in Examples and Comparative Examples was attached to a 6-inch quartz substrate treated with Cr through an adhesive at a load of 5 kgf (a pressure of 4.8 gf/mm$^2$) for 30 seconds, and left to stand for a day at room temperature (23±3° C.) to settle the adhesive on the substrate. The whole was kept at 50° C. for a month, and the adhesion face was observed visually and under a microscope.

good: no unusualness is observed, and
bad: a floating adhesive on the adhesion face is observed.

Examples 2 to 11 and Comparative Examples 1 to 3

As shown in Table 1, the different types and amounts of adhesives (SK-Dyne 1495, SK-Dyne 147311, SK-Dyne 1425) and curing agents (L-45, Y-75) were used to prepare adhesives. Each adhesive was used to produce a pellicle in the same manner as in Example 1.

Each of the produced pellicles and adhesives was subjected to the same evaluations as in Example 1, and the results are shown in Table 1.

TABLE 1

|  | main agent/ curing agent | main agent (part by weight) | curing agent (part by weight) | stroke (%) | tensile strength (N/cm$^2$) | peel strength (N/cm$^2$) | ratio of peel strength/ tensile strength | residue | attachment properties | durability |
|---|---|---|---|---|---|---|---|---|---|---|
| Example1 | 1495/L-45 | 100 | 0.09 | 1049 | 10.55 | 3.27 | 0.31 | B | good | good |
| Example2 | 1495/L-45 | 100 | 0.19 | 578 | 10.00 | 1.92 | 0.19 | A | good | good |
| Example3 | 1495/L-45 | 100 | 0.26 | 429 | 7.99 | 1.44 | 0.18 | A | good | good |
| Example4 | 1495/Y-75 | 100 | 0.09 | 700 | 11.77 | 1.92 | 0.16 | A | good | good |
| Example5 | 1495/Y-75 | 100 | 0.13 | 473 | 8.14 | 1.44 | 0.18 | A | good | good |
| Example6 | 1495/Y-75 | 100 | 0.19 | 324 | 11.06 | 1.63 | 0.15 | A | good | good |
| Example7 | 1495/Y-75 | 100 | 0.22 | 305 | 10.03 | 1.44 | 0.14 | A | good | good |
| Example8 | 1473H/L-45 | 100 | 0.13 | 1166 | 15.85 | 2.50 | 0.16 | B | good | good |
| Example9 | 1473H/L-45 | 100 | 0.19 | 652 | 10.56 | 2.40 | 0.23 | A | good | good |
| Example10 | 1473H/Y-75 | 100 | 0.13 | 697 | 13.60 | 2.88 | 0.21 | B | good | good |
| Example11 | 1473H/Y-75 | 100 | 0.22 | 515 | 12.43 | 2.60 | 0.21 | A | good | good |
| Comp. Ex.1 | 1495/Y-75 | 100 | 0.31 | 276 | 12.13 | 1.06 | 0.09 | A | bad | bad |
| Comp. Ex.2 | 1495/Y-75 | 100 | 0.06 | 678 | 7.39 | 2.60 | 0.35 | F | good | good |
| Comp. Ex.3 | 1425/L-45 | 100 | 0.08 | 2799 | 37.24 | 13.85 | 0.37 | F | good | good |

It is evident from the results in Table 1 that an adhesive having the ratio of the peel strength to the tensile strength of 0.33 or less can reduce a residue when a pellicle is separated from a photomask, and is preferred as the adhesive for a pellicle. An adhesive having a stroke of 660% or less can further reduce a residue so that it is preferred. In terms of attachment properties and durability, it is also evident from the results that an adhesive having a peel strength of 1.20 N/cm$^2$ or more can be sufficiently used as the adhesive for a pellicle.

The residual properties of an adhesive can be evaluated as the tensile strength, the peel strength and the stroke, which are parameters capable of being quantitatively determined, so that this evaluation method can facilitate the selection of an adhesive having low residual properties suited for the adhesive for a pellicle.

The invention claimed is:

1. An adhesive for a pellicle, the adhesive having a ratio of a peel strength to a tensile strength of from 0.10 to 0.33.

2. The adhesive for a pellicle according to claim 1, wherein the adhesive has a stroke of 660% or less, wherein the stroke is an elongation percentage at the time of breaking in measurement of the tensile strength.

3. The adhesive for a pellicle according to claim 1, wherein the peel strength is 1.20 N/cm$^2$ or more.

4. The adhesive for a pellicle according to claim 1, wherein the adhesive is an acrylic adhesive.

5. The adhesive for a pellicle according to claim 1, wherein the adhesive is a cured one from a composition comprising:
  an alkyl acrylate or methacrylate copolymer comprising 90 to 99% by weight of alkyl acrylate or methacrylate monomer units, and 1 to 10% of monomer units having reactivity with an epoxy group or an isocyanate group, and
  a curing agent which is an epoxy compound or an isocyanate compound, wherein the composition comprises substantially no surface modifier.

6. A pellicle comprising:
  a pellicle frame;
  a pellicle film provided over an upper end face of the pellicle frame; and
  the adhesive according to claim 1, adhered to a lower end face of the pellicle frame.

7. A method of selecting an adhesive for a pellicle, comprising steps of:
  measuring a tensile strength and a peel strength of an adhesive, and
  selecting an adhesive having a ratio of the peel strength to the tensile strength of from 0.10 to 0.33 as the adhesive for a pellicle.

* * * * *